(12) United States Patent
Cho et al.

(10) Patent No.: US 7,871,828 B2
(45) Date of Patent: Jan. 18, 2011

(54) IN-SITU DOSE MONITORING USING OPTICAL EMISSION SPECTROSCOPY

(75) Inventors: Seon-Mee Cho, Santa Clara, CA (US); Majeed A. Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/025,243

(22) Filed: Feb. 4, 2008

(65) Prior Publication Data

US 2008/0188013 A1 Aug. 7, 2008

Related U.S. Application Data

(60) Provisional application No. 60/888,435, filed on Feb. 6, 2007.

(51) Int. Cl.
*H01L 21/00* (2006.01)
(52) U.S. Cl. .................. 438/7; 257/E21.528; 438/16
(58) Field of Classification Search .............. 438/7, 438/16; 257/E21.528
See application file for complete search history.

(56) References Cited

U.S. PATENT DOCUMENTS

| | | | |
|---|---|---|---|
| 5,423,945 A | 6/1995 | Marks et al. | |
| 5,665,640 A | 9/1997 | Foster et al. | |
| 6,101,971 A * | 8/2000 | Denholm et al. | 118/723 E |
| 6,286,362 B1 | 9/2001 | Coffman et al. | |
| 6,350,697 B1 | 2/2002 | Richardson et al. | |
| 6,395,150 B1 | 5/2002 | Van Cleemput et al. | |
| 6,413,321 B1 | 7/2002 | Kim et al. | |
| 6,461,972 B1 | 10/2002 | Kabansky | |
| 6,559,026 B1 | 5/2003 | Rossman et al. | |
| 6,579,805 B1 | 6/2003 | Bar-Gadda | |
| 6,617,794 B2 | 9/2003 | Barnes et al. | |
| 6,627,463 B1 | 9/2003 | Sarfaty | |
| 6,649,075 B1 | 11/2003 | Buie et al. | |
| 6,800,559 B2 | 10/2004 | Bar-Gadda | |
| 6,870,170 B1 | 3/2005 | Farley et al. | |
| 6,965,116 B1 | 11/2005 | Wagner et al. | |
| 7,037,813 B2 | 5/2006 | Collins et al. | |
| 7,078,711 B2 | 7/2006 | Borden | |

(Continued)

FOREIGN PATENT DOCUMENTS

EP 0 942 453 9/1999

(Continued)

OTHER PUBLICATIONS

First Office Action dated Nov. 13, 2009 for Chinese Patent Application No. 2008100082114. (APPM/011472 CHIN).

(Continued)

*Primary Examiner*—Matthew C Landau
*Assistant Examiner*—Jessica Hall
(74) *Attorney, Agent, or Firm*—Patterson & Sheridan, LLP

(57) ABSTRACT

The present invention generally provides methods and apparatus for monitoring ion dosage during a plasma process. One embodiment of the present invention provides a method for processing a substrate comprising generating a correlation between the at least one attribute of optical emissions of the plasma and a dosage quantity. In one embodiment, the attribute of optical emissions of the plasma is optical emission intensity of an ion species in the plasma.

8 Claims, 8 Drawing Sheets

U.S. PATENT DOCUMENTS

| | | |
|---|---|---|
| 7,137,354 B2 * | 11/2006 | Collins et al. .......... 118/723 IR |
| 2003/0013260 A1 | 1/2003 | Gossmann et al. |
| 2003/0013314 A1 | 1/2003 | Ying et al. |
| 2003/0085205 A1 | 5/2003 | Lai et al. |
| 2003/0153101 A1 | 8/2003 | Takase et al. |
| 2005/0051271 A1 | 3/2005 | Collins et al. |
| 2005/0230047 A1 | 10/2005 | Collins et al. |
| 2006/0081558 A1 | 4/2006 | Collins et al. |
| 2006/0088655 A1 | 4/2006 | Collins et al. |
| 2008/0075834 A1 * | 3/2008 | Ramaswamy et al. .......... 427/8 |

FOREIGN PATENT DOCUMENTS

| | | |
|---|---|---|
| EP | 1 158 071 | 11/2001 |
| JP | 07 004555 | 1/1995 |
| JP | 2000-150908 | 5/2000 |

OTHER PUBLICATIONS

Office Action dated Jan. 26, 2010 for Korean Patent Application No. 2008-11522.

* cited by examiner

IN-SITU DOSE MONITORING USING OPTICAL EMISSION SPECTROSCOPY

CROSS-REFERENCE TO RELATED APPLICATIONS

This application claims priority to U.S. Provisional Patent Application Ser. No. 60/888,435, filed Feb. 6, 2007, which is incorporated herein by reference.

BACKGROUND OF THE INVENTION

1. Field of the Invention

Embodiments of the present invention generally relate to method and apparatus for processing a substrate. Particularly, embodiments of the present invention relate to methods and apparatus for monitoring dosages of one or more species during plasma processing of semiconductor substrates.

2. Description of the Related Art

It is important to control ion dosage during plasma processes, such as plasma enhanced chemical vapor deposition (PECVD) process, high density plasma chemical vapor deposition (HDPCVD) process, plasma immersion ion implantation process (P31), and plasma etch process. Ion implantation processes in integrated circuit fabrication particularly require instrumentation and control to achieve a desired ion dose on a semiconductor substrate.

The dose in ion implantation generally refers to the total number of ions per unit area passing through an imaginary surface plane of a substrate being processed. The implanted ions distribute themselves throughout the volume of the substrate. The principal variation in implanted ion density (number of ions per unit volume) occurs along the direction of the ion flux, usually the perpendicular (vertical) direction relative to the substrate surface. The distribution of ion density (ions per unit volume) along the vertical direction is referred to as the ion implantation depth profile. Instrumentation and control systems for regulating ion implant dose (ions per unit area) are sometimes referred to as dosimetry.

Ion implantation may be performed in ion beam implant apparatus and in plasma immersion ion implantation apparatus. Ion beam implant apparatus, which generate a narrow ion beam that must be raster-scanned over the surface of the substrate, typically implant only a single atomic species at one time. The ion current in such an apparatus is precisely measured and integrated over time to compute the actual dose. Because the entire ion beam impacts the substrate and because the atomic species in the beam is known, the ion implant dose can be accurately determined. This is critical in an ion beam implant apparatus, because it employs a D.C. ion source, which is subject to significant drift in its output current, and the various grids and electrodes employed in the beam implant machine drift as well (due to the susceptibility of a D.C. source to accumulation of deposited material on component surfaces). Accordingly, precise dosimetry is essential in an ion beam implant apparatus. The precisely monitored ion beam current is integrated over time to compute an instantaneous current implant dose, and the process is halted as soon as the dose reaches a predetermined target value.

In contrast, plasma immersion ion implantation reactors present a difficult problem in dosimetry. Typically, the atomic weight of the ions incident on the substrate cannot be precisely determined because such a reactor employs a precursor gas containing the desired ion implantation species as well as other species. For example, since pure boron is a solid at room temperature, plasma immersion ion implantation of boron must employ a multi-species gas such as $B_2H_6$ as the plasma precursor, so that both boron and hydrogen ions are incident on the substrate. As a result, determining the boron dose from a measured current is difficult. Another difficulty in implementing dosimetry in a plasma immersion ion implantation reactor is that the plasma ions impact the entire substrate continuously, so that it is difficult to effect a direct measurement above the substrate of the total ion current to the substrate. Instead, the dose must be indirectly inferred from measurements taken over a very small area. A further difficulty encountered in some plasma immersion ion implantation reactors is the presence of electromagnetic noise or interference in the chamber that can prevent a precise measurement of ion current. This is particularly true of reactors employing RF plasma source power or RF plasma bias power.

Plasma immersion ion implantation reactors employing D.C. (or pulsed D.C.) plasma source power are susceptible to drift in the plasma ion current due to deposition of material on internal reactor components from the plasma. Such reactors therefore require precise real-time dosimetry. This problem has been addressed by providing a small orifice in the wafer support pedestal or cathode outside of the substrate periphery, for plasma ions to pass through into the interior volume of the cathode. An electrode sometimes referred to as a Faraday cup faces the orifice and is biased to collect the ions passing through the orifice. The interior of the cathode can be evacuated to a slightly lower pressure than the plasma chamber to ensure efficient collection of ions through the orifice. A current sensor inside the cathode interior measures the current flowing between the ion-collecting electrode and its bias source. This current can be used as the basis of a dosimetry measurement. One problem with such an arrangement is that the current measurement cannot distinguish between different atomic species, and therefore cannot provide an accurate measurement of the species of interest (e.g., boron). Another problem is that the transmission of the measured current from the current sensor inside the cathode interior to an external controller or processor can be distorted by the noisy electromagnetic environment of the plasma reactor.

Another problem is that the orifice in the cathode constitutes an intrusion upon the ideal plasma environment, because the orifice can distort the electric field in the vicinity of the substrate periphery. Furthermore, plasma passing through the orifice can cause problems by either sputtering the orifice surfaces or by depositing on the orifice interior surfaces, requiring the periodic cleaning of the orifice interior.

In plasma immersion ion implantation reactors employing RF plasma source power, precise or real-time dose measurement typically was not critical. This is due in part to the fact that an RF plasma is relatively impervious to deposition of material on internal chamber components, so that the ion flux at the wafer surface does not drift significantly, compared to a reactor employing a D.C. plasma source. Moreover, real-time dose measurement in such a reactor is difficult. For example, the harsh RF environment of such a reactor would distort an ion current measurement taken inside the cathode (as described above) as it is conveyed to an external controller or processor. To avoid such problems, implant dose can be reliably controlled based upon the predicted or estimated time required to reach the target implant dose. However, a real-time does control is more and more in need as the feature size becomes smaller and smaller in the semiconductor devices.

Therefore, there is a need for precise real-time dosimetry in a plasma processing chamber, such as an RF plasma immersion ion implantation reactor.

SUMMARY OF THE INVENTION

The present invention generally provides methods and apparatus for monitoring ion dosage during plasma processing in a variety of processing chambers.

One embodiment of the present invention provides a method for processing a substrate comprising obtaining a correlation between at least one attribute of a plasma generated in a plasma reactor and a dosage quantity of one or more ions in the plasma, wherein the plasma reactor is configured to perform a plasma process, and the plasma reactor comprises a sensor configured to monitor the at least one attribute of the plasma generated in the plasma reactor, positioning the substrate in the plasma reactor, generating a plasma in the plasma reactor to start the plasma process, obtaining a real time value of the at least one attribute of the plasma using the sensor, and determining an end point of the plasma process according the real time value of the at least one attribute of the plasma and the correlation between the at least one attribute of the plasma and the dosage quantity of one or more ions in the plasma.

Another embodiment of the present invention provides an apparatus for processing a substrate comprising a process chamber defining a process volume; a conductive support pedestal positioned in the process volume, a gas distribution assembly connected to a gas panel and positioned parallel the conductive support pedestal, wherein an RF plasma bias power supply is coupled between the gas distribution assembly and the conductive support pedestal, a toriodal plasma source in fluid communication with the process volume, a sensor configured to monitor one or more attributes of a plasma generated in the process volume, and a controller coupled to the sensor, wherein the controller is configured to receive and analyze signals from the sensor.

Yet another embodiment of the present invention provides a method for implanting a desired dose of an element into a substrate comprising providing a plasma reactor having a sensor configured to monitoring an attribute of the element in excited states, generating a correlation between the attribute of the element and a dosage value of the element, positioning the substrate in the plasma reactor, generating a plasma comprising the element in excited states in the plasma reactor, obtaining a real time value of the attribute of the element using the sensor, determining a real time dosage value of the element using the correlation between the attribute of the element and the dosage value of the element, and terminating the plasma when the real time dosage value is within an error range of the desired dose.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention provide methods for monitoring ion dosages in plasma processes and apparatus for performing the methods.

Figure 1:
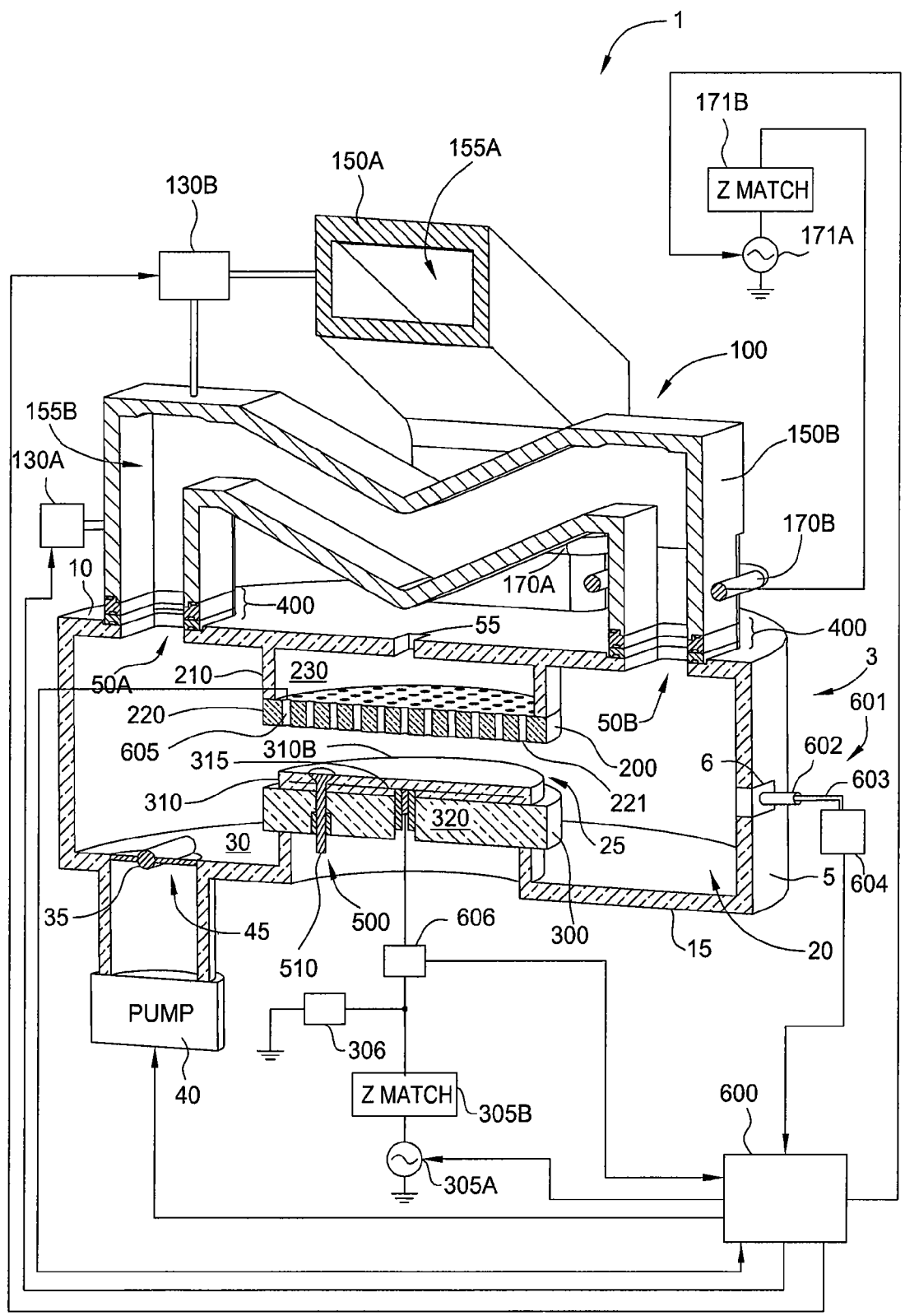
FIG. 1 schematically illustrates an isometric cross-sectional view of a plasma chamber in accordance with one embodiment of the present invention.

FIG. 1 schematically illustrates an isometric cross-sectional view of a plasma chamber 1 in accordance with one embodiment of the present invention. The plasma chamber 1 may be configured for a plasma enhanced chemical vapor deposition (PECVD) process, a high density plasma chemical vapor deposition (HDPCVD) process, an ion implantation process, an etch process, and other plasma processes.

The plasma reactor 1 comprises a toroidal plasma source 100 coupled to a body 3 of the plasma chamber 1. The body 3 comprises sidewalls 5 coupled to a lid 10 and a bottom 15, and bounds an interior volume 20. Other examples of the plasma chamber 1 may be found in U.S. Pat. No. 6,939,434, filed Jun. 5, 2002 and issued on Sep. 6, 2005 and U.S. Pat. No. 6,893,907, filed Feb. 24, 2004 and issued May 17, 2005, both of which are incorporated by reference herein in their entireties.

The interior volume 20 includes a processing region 25 formed between a gas distribution assembly 200 and a substrate support 300. A pumping region 30 surrounds a portion of the substrate support 300. The pumping region 30 is in selective communication with a vacuum pump 40 through a valve 35 disposed in a port 45 formed in the bottom 15. In one embodiment, the valve 35 is a throttle valve adapted to control the flow of gas or vapor from the interior volume 20 and through the port 45 to the vacuum pump 40. In one embodiment, the valve 35 operates without the use of o-rings, and is further described in United States Patent Publication No. 2006/0237136, filed Apr. 26, 2005, which is incorporated by reference in its entirety.

Figure 2:
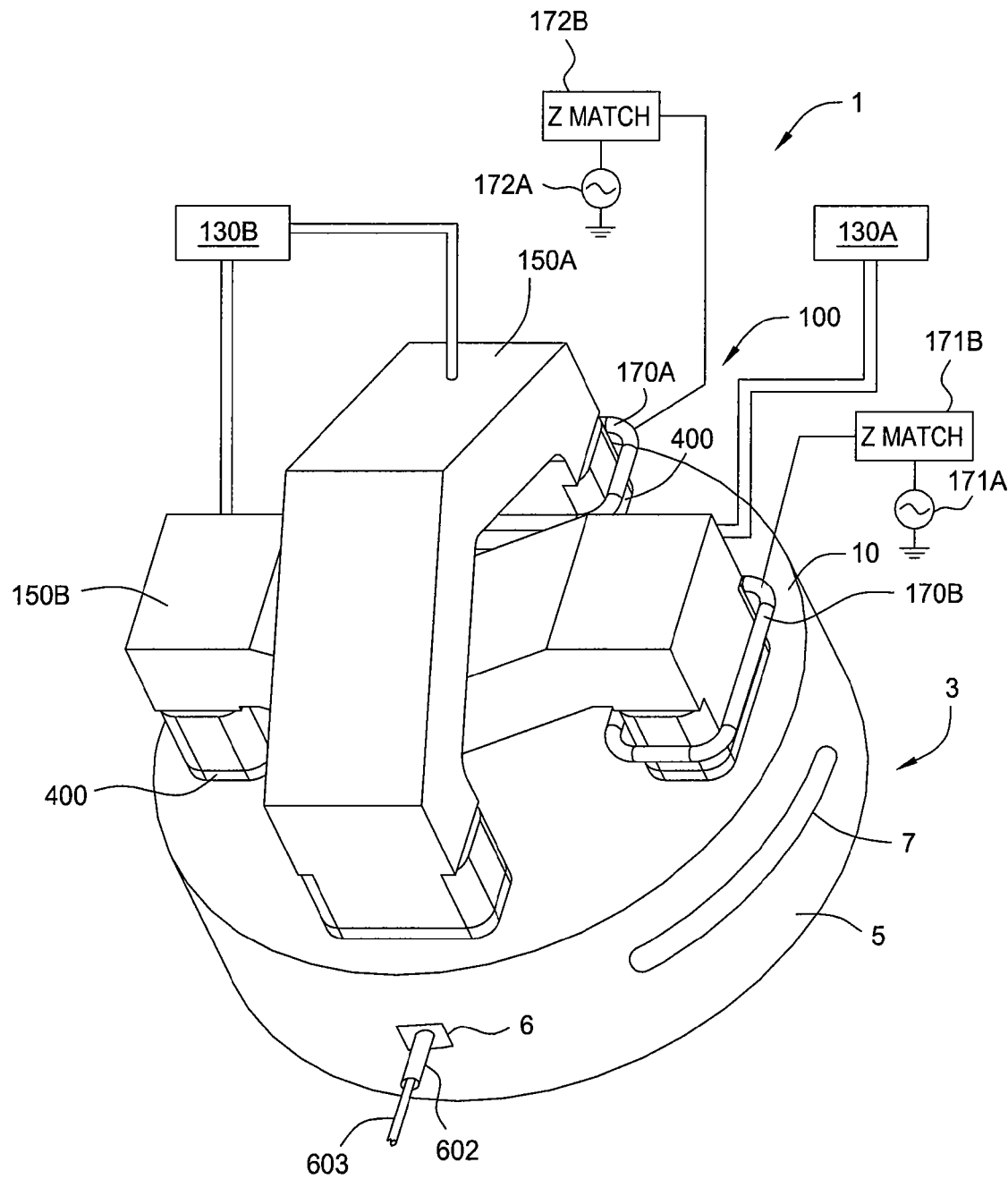
FIG. 2 schematically illustrates an isometric top view of the plasma chamber of FIG. 1.

A toroidal plasma source 100 is disposed on the lid 10 of the body 3. In one embodiment, the toroidal plasma source 100 comprises a first conduit 150A having a general "U" shape, and a second conduit 150B having a general "M" shape. The first conduit 150A and the second conduit 150B each include at least one antenna 170A and 170B respectively. The antennas 170A and 170B are configured to form an inductively coupled plasma within an interior region 155A/155B of each of the conduits 150A/150B, respectively. As shown in FIG. 2, each antenna 170A/170B may be a winding or a coil coupled to a power source, such as a RF power source 171A/171B. An RF impedance matching systems 172A/172B may also be coupled to each antenna 170A/170B. Process gases, such as helium, argon, and other gases, may be provided to an interior region 155A, 155B of each of the conduits 150A, 150B, respectively. In one embodiment, the process gases may contain a dopant containing gases that is supplied to the interior regions 155A/155B of each conduit 150A/150B. In one embodiment, the process gases may be delivered to the toroidal plasma source 100 from a gas panel 130B. In another embodiment, the process gases may be delivered through the gas distribution assembly 200 from a gas panel 130A connected to a port 55 formed in the body 3 of the plasma chamber 1.

In one embodiment, each opposing end of the conduits 150A/150B are coupled to respective ports 50A-50D (only 50A and 50B are shown in this view) formed in the lid 10 of the plasma chamber 1. During processing, a process gas is supplied to the interior region 155A/155B of each of the conduits 150A/150B, and RF power is applied to each antenna 170A/170B, to generate a circulating plasma path that travels through the ports 50A-50D and the processing region 25. Specifically, in FIG. 1, the circulating plasma path travels through port 50A to port 50B, or vise versa, through the processing region 25 between the gas distribution assembly 200 and the substrate support 300. Each conduit 150A/150B comprises a plasma channeling section 400 coupled between respective ends of the conduit 150A/150B and the ports 50A-50D. In one embodiment, the plasma channeling section 400 is configured to split and widen the plasma path formed within each of the conduits 150A/150B.

The gas distribution assembly 200 comprises an annular wall 210 and a perforated plate 220. The annular wall 210, the perforated plate 220 and the lid 10 define a plenum 230. The perforated plate 220 includes a plurality of openings 221 formed therethrough in a symmetrical or non-symmetrical pattern or patterns. In one embodiment, the dopant containing process gases may be delivered to processing region 25 from the gas distribution assembly 200 connected to the gas panel 130A. The process gases, such as dopant-containing gases, may be provided to the plenum 230 from the port 55. Generally, the dopant-containing gas is a chemical consisting of the dopant impurity atom, such as boron (a p-type conductivity impurity in silicon) or phosphorus (an n-type conductivity impurity in silicon) and a volatile species such as fluorine and/or hydrogen. Thus, fluorides and/or hydrides of boron, phosphorous or other dopant species such as arsenic, antimony, etc., can be dopant gases. For example, where a Boron dopant is used the dopant-containing gas may contain boron trifluoride ($BF_3$) or diborane ($B_2H_6$). The gases may flow through the openings 221 and into the processing region 25 below the perforated plate 220. In one embodiment, the perforated plate 220 is RF biased to help generate and/or maintain a plasma in the processing region 25.

The substrate support 300 comprises an upper plate 310 and a cathode assembly 320. The upper plate 310 has a smooth substrate supporting surface 310B configured to support a substrate thereon. The upper plate 310 comprises an embedded electrode 315 which is connected to a DC power source 306 to facilitate electrostatic attraction between a substrate and the substrate supporting surface 310B of the upper plate 310 during processing. In one embodiment, the embedded electrode 315 may also be used as an electrode for providing capacitive RF energy to the processing region 25. The embedded electrode 315 may be coupled to a RF bias power 305A via an RF impedance matching circuit 305B.

The substrate support 300 may also include a lift pin assembly 500 that contains a plurality of lift pins 510 configured to transfer one or more substrates by selectively lifting and supporting a substrate above the upper plate 310. The lift pins 510 are spaced to allow a robot blade to position therebetween.

FIG. 2 schematically illustrates an isometric top view of the plasma chamber 1 shown in FIG. 1. The sidewall 5 of the plasma chamber 1 has a substrate port 7 that may be selectively sealed by a slit valve (not shown). Process gases are supplied to the gas distribution assembly 200 by the gas panel 130A coupled to the port 55. One or more process gases may be supplied to the first and second conduits 150A, 150B through the gas panel 130B.

The plasma chamber 1 further comprises a controller 600 configured to monitor and control processes performed in the plasma chamber 1. The controller 600 may be connected with one or more sensors and configured for sampling, analyzing, and storing sensor data. In one embodiment, the controller 600 may have the capacity to perform control tasks for different processes. The controller 600 may be connected to operating parts of the plasma chamber 1 and send control signals to the operating parts. The controller 600 may perform a closed loop control task by adjusting process parameters according to sensor data to achieve desired process result.

As shown in FIG. 1, an optical emission spectrometer 601 is disposed adjacent a quartz window 6 formed on the body 3. The optical emission spectrometer 601 is configured to quantitatively measure optical emissions from excited species in the plasma generated inside the plasma chamber 1. Excited species in a plasma may decay back from the excited energy level to the lower energy level by emitting light. Since the transition is between distinct atomic energy levels, wavelength of the emitted light may be used to identify the excited species. In one embodiment, intensity of the emitted lights may reflect concentration or distribution of different species in a plasma including one or more species. Plasma generally generate electromagnetic radiation that includes emissions having wavelengths in the optical spectrum, i.e., from about 180 nm to about 1100 nm. A portion of these emissions can be detected by a spectrometer, such as the optical emission spectrometer 601, or other suitable devices such as a monochromator of a spectral filter equipped with one or more photodiodes.

The optical emission spectrometer (OES) 601 may comprise a lens 602 disposed next to the quartz window 6. The lens 602 may be configured to collimate radiation of the plasma passes through the quartz window 6 in to an optical fiber cable 603 connected to the spectrometer 604. The spectrometer 604 spectrally separates the radiation based on wavelength and generates detection signals for one or more spatially separated wavelengths. A data acquisition device in the controller 600 may be used to collect data representing separated wavelength, hence properties of the ion species in the plasma, at a periodic sampling rate. The collected data may be processed and analyzed for generating control singles to the RF plasma bias power 305A, the RF plasma source powers 171A/171B, the gas panels 130A/130B, the pump 40, or any other controllable components of the plasma chamber 1 to adjust process parameters, for example pressure, power intensities, flow rates, process duration.

Other sensors may also be used to measure process properties in the plasma chamber 1. In one embodiment, a mass distribution sensor 605 configured to measure distribution of different species in the plasma may be positioned in the gas distribution assembly 200. In another embodiment, a voltage/current sensor 606 may be between the RF impedance matching circuit 305B and the embedded electrode 315 to monitor current and voltage provided to the embedded electrode 315.

In one embodiment of the presentation, peak intensity of one or more ion species of a plasma measured by a spectrometer, such as the optical emission spectrometer 601, may be used to monitor and control one or more ion dosages in a plasma process, for example a plasma enhanced chemical vapor deposition (PECVD) process, a high density plasma chemical vapor deposition (HDPCVD) process, an ion implantation process, an etch process, and other plasma processes.

In one embodiment, peak intensity of one or more ion species in a dopant containing plasma may be used to control dosage of a plasma immersion ion implantation process.

Figure 3:
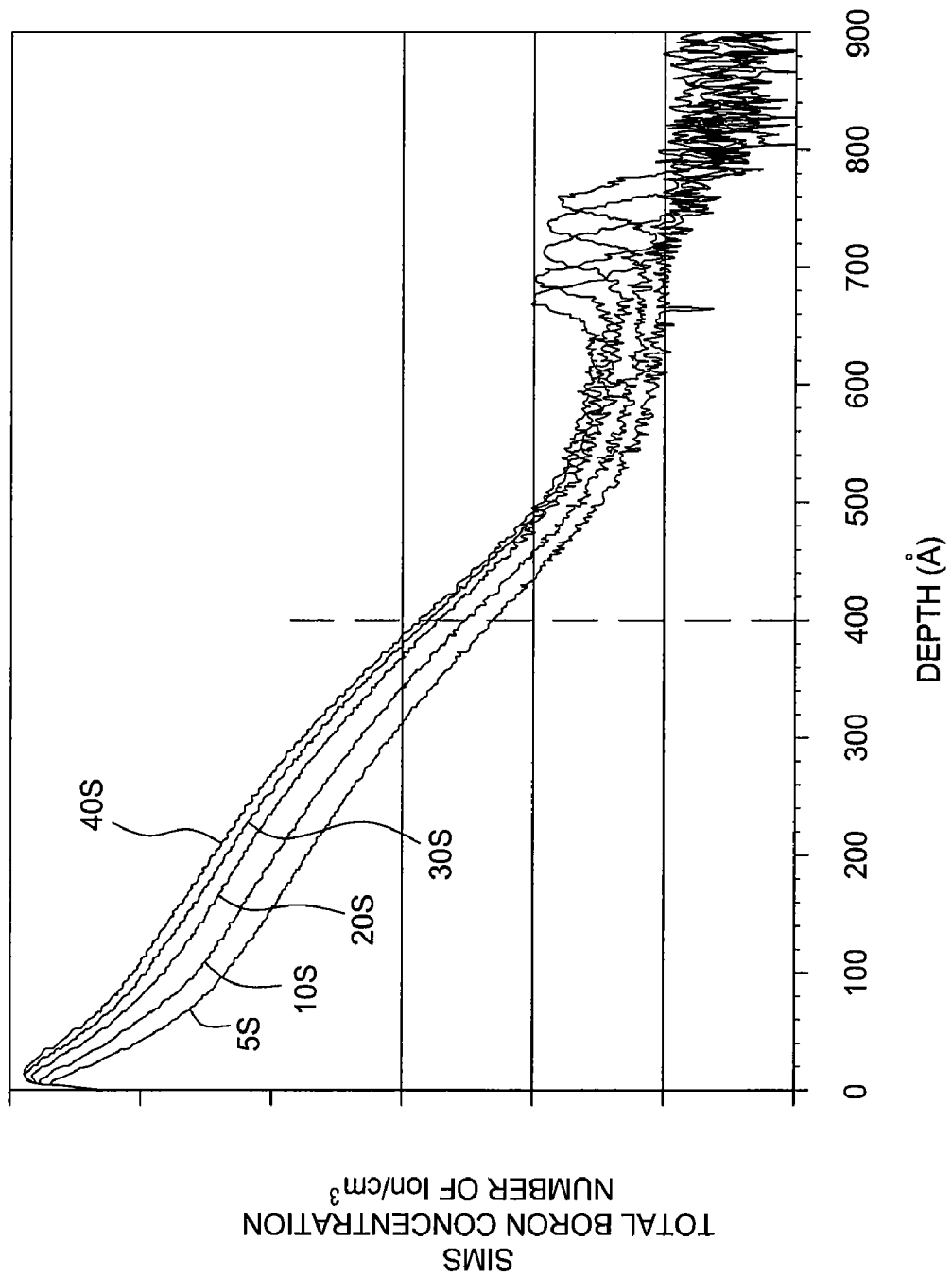
FIG. 3 schematically illustrates results of Boron implantation density distribution over depth.

Actual dosage of an ion implantation on a substrate may be determined by post process measurement, such as secondary ion mass spectrometry (SIMS). Upon completion of an ion implantation, the substrate may be measured using SIMS, in which a small spot of the substrate is sputtered while a quadrapole mass spectrometer senses the secondary ion emission as a function of sputter depth to obtain an ion implantation density distribution over depth of the species of interests. FIG. 3 schematically illustrates results of Boron implantation density distribution over depth in testing substrates that are implanted with Boron at the same process condition for different time durations, which are 5 seconds, 10 seconds, 20 seconds, 30 seconds, and 40 seconds respectively. The x axis of FIG. 3 indicates depth of the measured spot in the substrates. The y axis indicates the total Boron concentration in number of ion per cubic centimeter. The actual dosage of Boron (number of ion per square centimeter) in each substrate may be calculated by integrating the total concentration over depth.

In generally, peak intensity of an ion species in a plasma measured from an OES increases significantly with increment of chamber pressure and increment of power level of the RF bias power, e.g. power level from the RF plasma bias power 305A. The peak intensity increases slightly with increases of flow rates of processing gases and increment of power level of RF power sources, e.g. the RF plasma sources 171A/171B.

Figure 4:
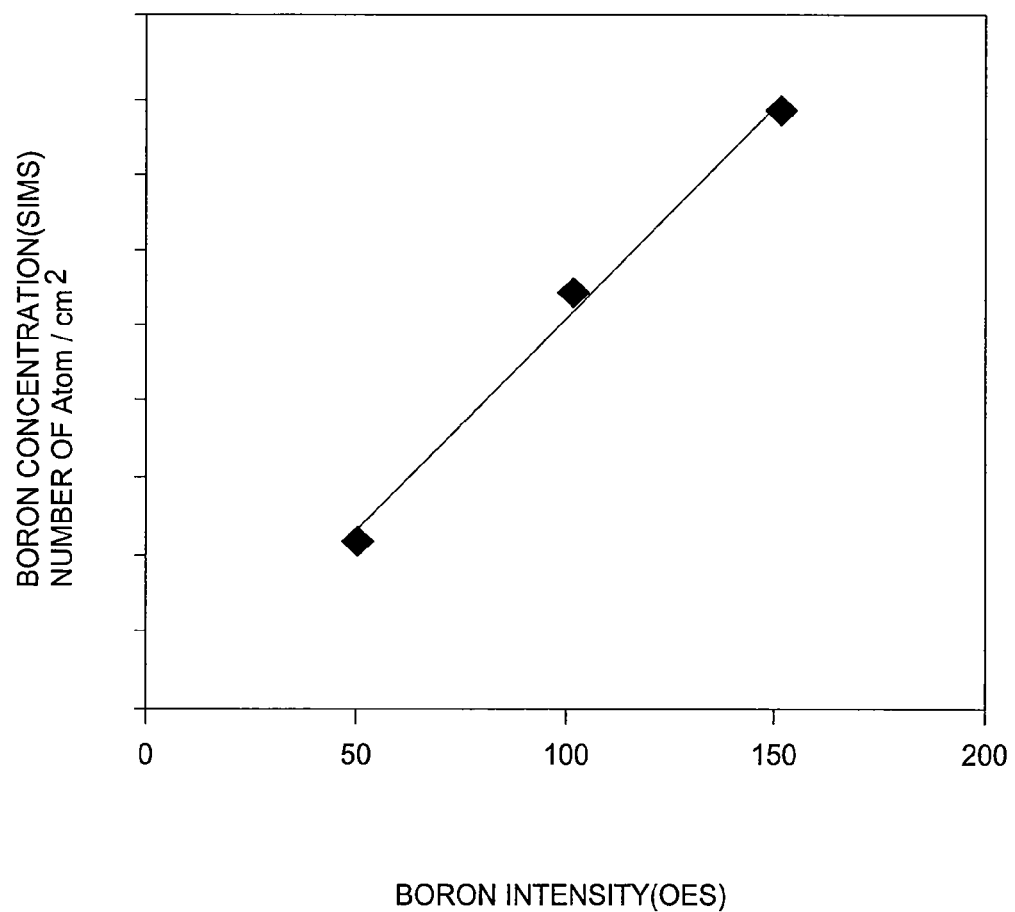
FIG. 4 schematically illustrates a linear relationship between dosage and measured dopant peak intensity for a Boron implantation.

It has been observed that dosage of dopant has a substantially linear correlation with peak intensity of the dopant during a process while process parameters are kept the same. FIG. 4 schematically illustrates the linear relationship between dosage and measured dopant peak intensity for a Boron implantation. The x axis indicates (average) Boron peak intensity during an implantation process using an optical emission spectrometer. The y axis indicates Boron concentration in the substrate calculated from SIMS measurement of the substrate. As shown in FIG. 4, the Boron concentration is substantially linear to the Boron peak intensity.

In one embodiment of the present invention, a linear correlation of a peak intensity for a species of interest and the dosage of the species, such as the linear correlation shown in FIG. 4, may be obtained prior to a process, and an estimated dosage may be obtained from the peak intensity measurement during a process and the linear correlation.

One embodiment of the present invention provides a dosage control method by determining an end point using peak intensity measurement of the species of interest.

Figure 5:
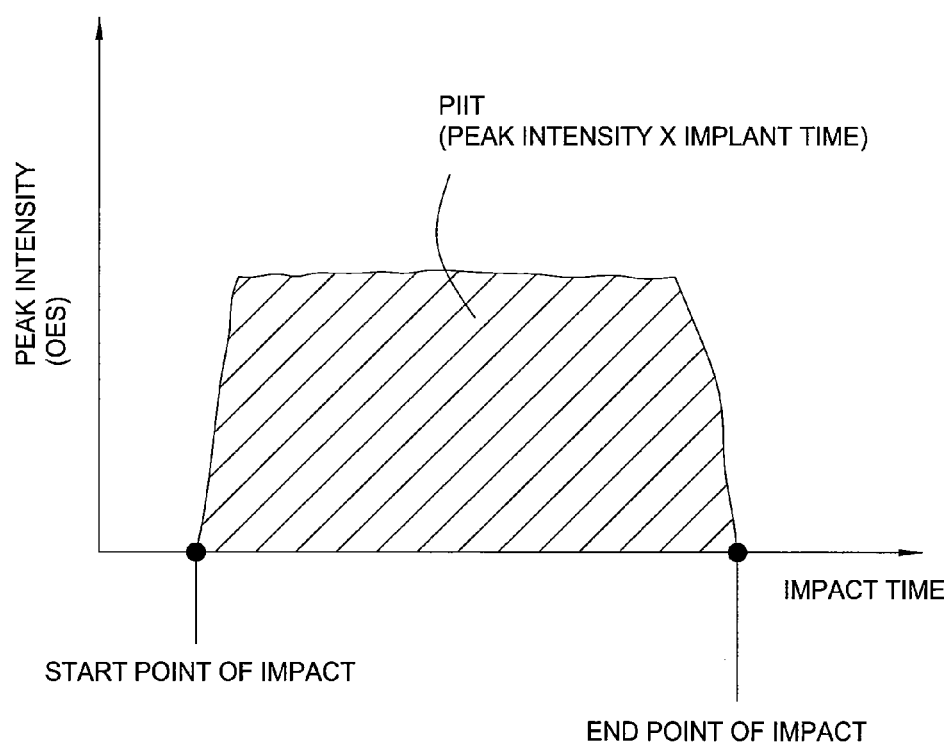
FIG. 5 schematically illustrates peak intensity of an ion species in a plasma during an implantation process.

FIG. 5 schematically illustrates peak intensity of an ion species in a plasma during an implantation process. The x axis indicates time. The y axis indicates peak intensity, which may be measured using OES. Size of the hatched area indicates a product of the peak intensity and implant time (hereafter PIIT). During process, PIIT may be calculated by integrating measured peak intensity over time. A substantial linear correlation has been observed between PIIT and dosage.

Figure 6:
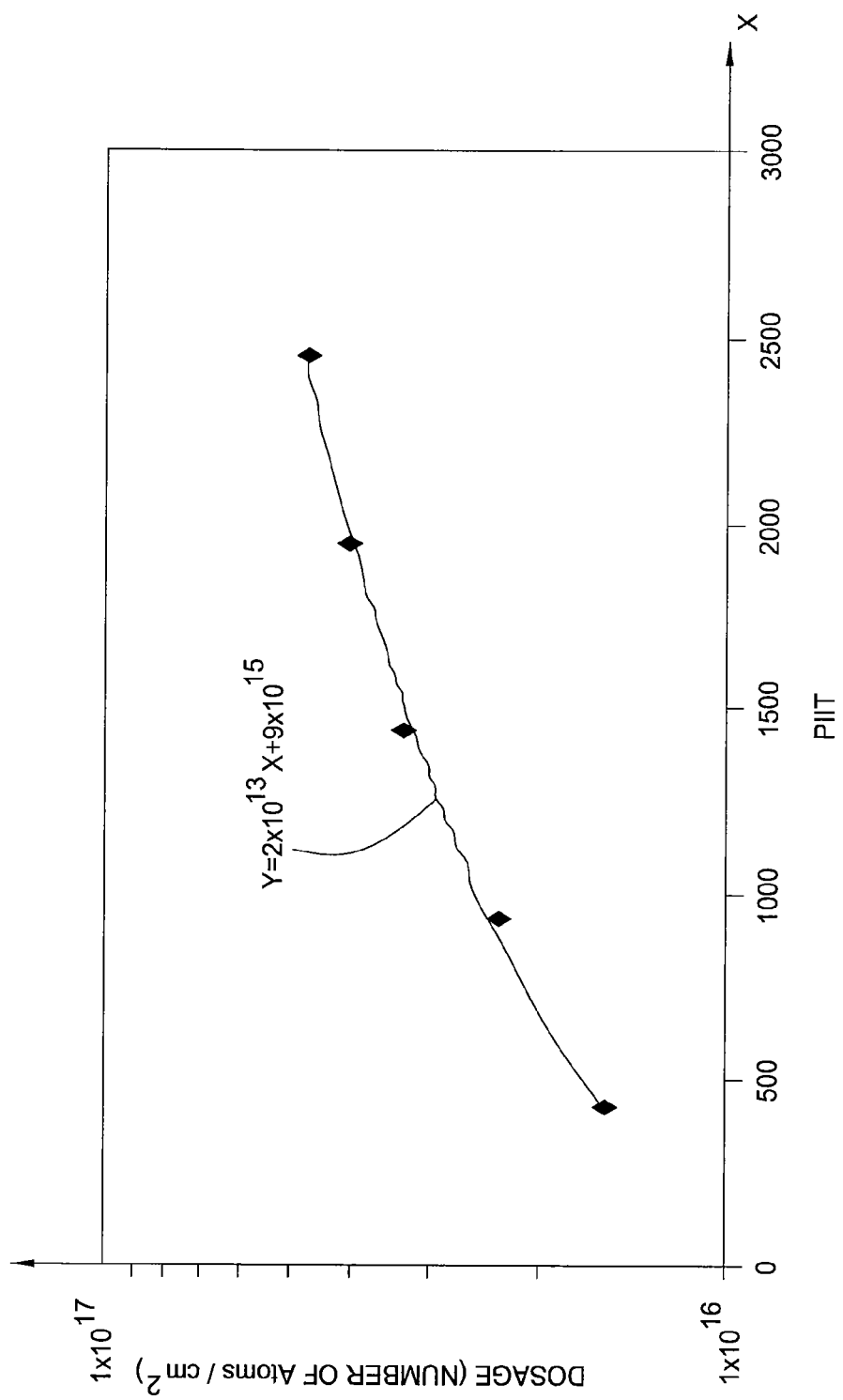
FIG. 6 schematically illustrates a linear correlation between PIIT (Peak Intensity Integrated over Time) and dosage values of a Boron implantation process.

FIG. 6 schematically illustrates a linear correlation between PIIT and dosage values of a Boron implantation process. The x axis indicates PIIT values calculated from peak intensity measurements from OES of a process. The y axis indicates actual dosage measurement from SIMS performed after the process. The dosage-PIIT pairs of five sample substrates appear to be substantially linear as shown by the solid line $y=2\times10^{13}x+9\times10^{15}$. Accordingly, dosage of a plasma process may be determined in-situ from a real time PIIT value and a predetermined correlation between PIIT and dosage.

Figure 7:
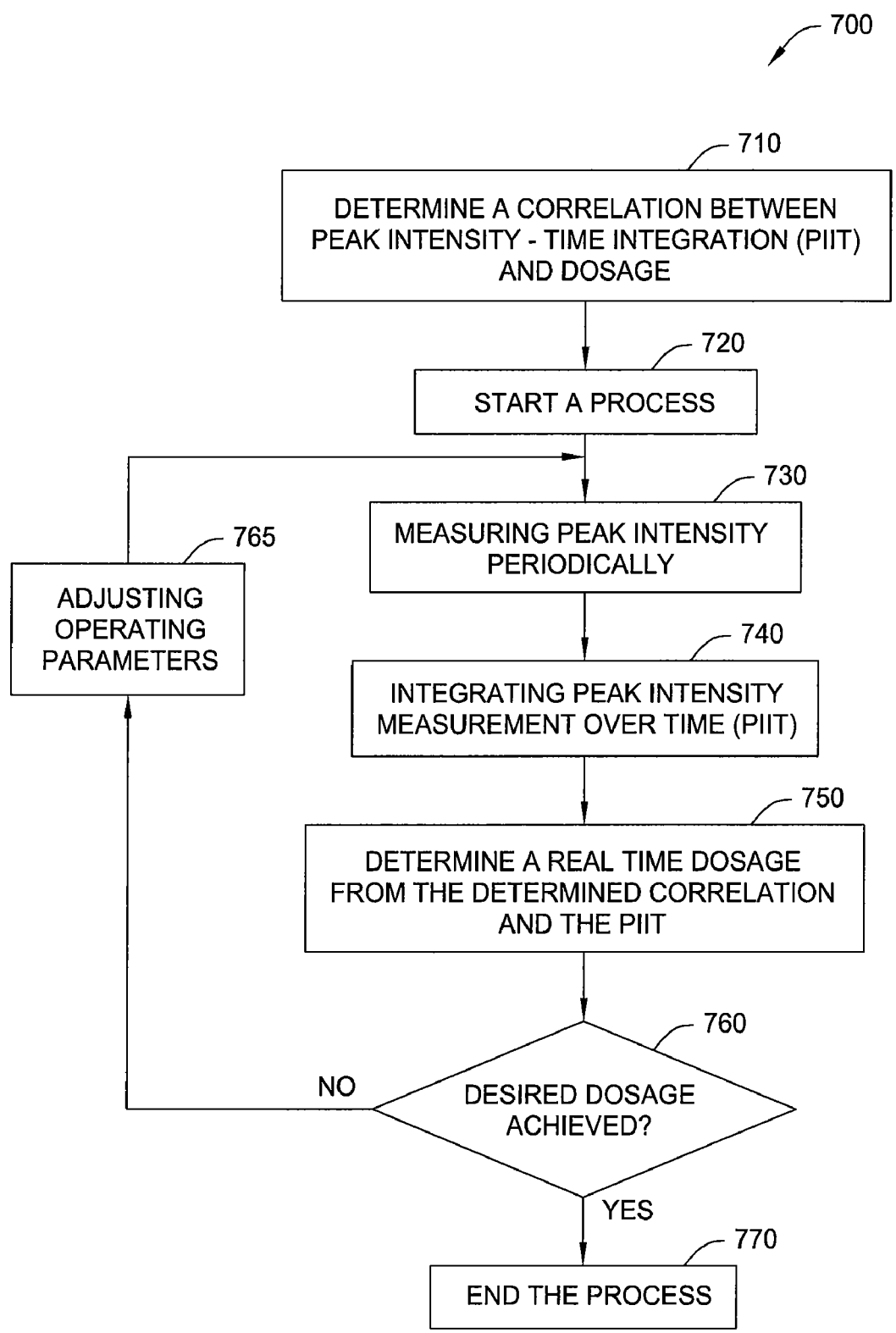
FIG. 7 illustrates a method for end point detection for a plasma process in accordance with one embodiment of the present invention.

FIG. 7 illustrates a method 700 for end point detection for a plasma process in accordance with one embodiment of the present invention.

In step 710, correlations between dosages of one or more species of interest and PIIT of the corresponding one or more species may be determined. The determination may be performed by conducting a number of test runs of the target process. PIIT of each test run may be calculated and actual dosage of each test run obtained. In one embodiment, a correlation may be obtained in form of a lookup table for a plurality of dosage-PIIT value pairs. A dosage may be obtained for a given PIIT value by looking up the lookup table. When a given PIIT value falls in between two PIIT values in the lookup table, an interpolation may be performed for the corresponding dosage. In another embodiment, the correlation may be obtained in form of a mathematical formula, such as a linear polynomial, and a dosage of a given PIIT value may be obtained by plugging the given PIIT value to the mathematical formula.

In step 720, a plasma process may be started. This step may include positioning a substrate in the plasma chamber, pumping down the plasma chamber, flowing in processing gases, and/or generating a plasma.

In step 730, peak intensity of one or more species of interest may be measured periodically using a spectrometer, such as an OES.

In step 740, a real time PIIT value may be calculated my integrating each peak intensity measurement over time.

In step 750, a real time dosage may be determined using the real time PIIT value and the determined correlations.

In step 760, the real time dosage may be compared with a desired dosage. If the desired dosage has been achieved, the process will be ended in step 770. If the desired dosage has not yet been achieved, the process continues. In one embodiment, step 765 may be performed to adjust operating parameters to according to the real time peak intensity and/or dosage values.

The method 700 may be used to actively adjust implant time to achieve desired dose within set error limits even if there is a systematic drift in the plasma, when a desired peak intensity increases or decreases with time in short or long term. Thus, the method 700 provides great consistency in production even the processing environment changes with time.

In another embodiment, the method 700 may be used to "repair" a substrate when an interruption of plasma occurs in the middle of the process run.

The present invention further provides methods to monitoring process recipe by monitoring peak intensity of one or more ion species in a plasma. Peak intensity, such as monitored by OES, may be used to interdict a process when a peak intensity of certain ion species is not within the set recipe due to gas, plasma or process instability and drifts outside the set intensity limits.

Figure 8:
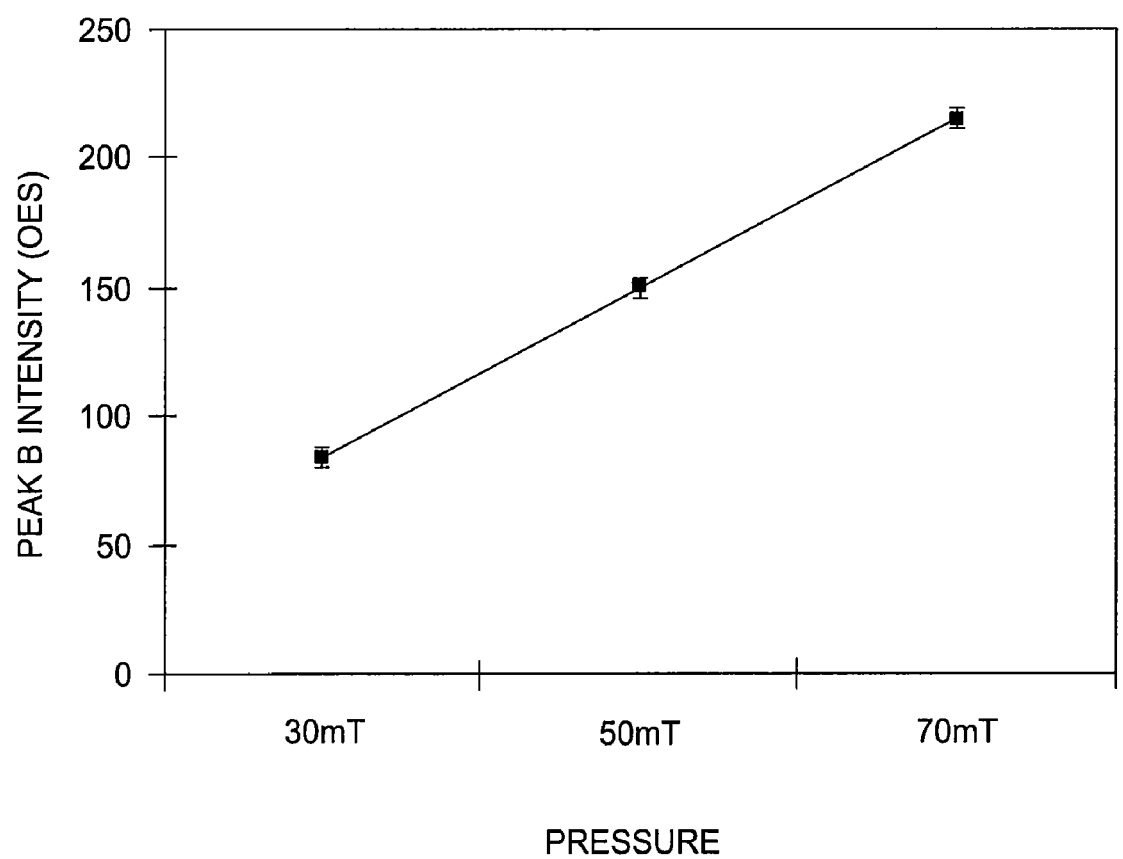
FIG. 8 schematically illustrates a chart of measured Boron peak intensity in view of chamber pressure in a process using a Boron containing plasma.

As described above, peak intensity of an ion species in a plasma increases with increasing chamber pressure. It has been observed that peak intensity measured by OES is substantially linear to the chamber pressure. FIG. 8 schematically illustrates a chart of measured Boron peak intensity in view of chamber pressure in a process using a Boron containing plasma. The linear relationship between peak intensity and chamber pressure may be used to monitor plasma pressure during process. Pressure requirement may be mapped to set limits of peak intensity and the process may be interdicted when the peak intensity drifts out of the set limits.

In another embodiment, peak intensity of one or more ion species may be monitored to ensure that the correct gases are supplied to the chamber with correct flow rate.

While the ion implantation of Boron (B) is described in the present application, the method and apparatus of the present invention may be used to monitor and control dosage of Arsenic (As), Phosphorus (P), Hydrogen (H), Oxygen (O), Fluorine (F), Silicon (Si), and other species used in a plasma process.

While method and apparatus of the present invention is described in accordance with a plasma immersion ion implantation process, persons skilled in the art may find it suitable to other plasma processes, such as a plasma enhanced chemical vapor deposition (PECVD) process, a high density plasma chemical vapor deposition (HDPCVD) process, an ion implantation process, and an etch process.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
    obtaining a correlation between at least one attribute of optical emissions of a plasma generated in a plasma reactor and a dosage quantity of one or more ions in the plasma, wherein the plasma reactor is configured to perform a plasma process, and the plasma reactor comprises a sensor configured to monitor the at least one attribute of optical emissions of the plasma generated in the plasma reactor;
    positioning the substrate in the plasma reactor;
    generating a plasma in the plasma reactor to start the plasma process;
    obtaining a real time value of the at least one attribute of optical emissions of the plasma using the sensor; and
    determining an end point of the plasma process according the real time value of the at least one attribute of optical emissions of the plasma and the correlation between the at least one attribute of optical emissions of the plasma and the dosage quantity of one or more ions in the plasma, wherein the at least one attribute of optical emissions of the plasma is calculated from an optical emission peak intensity of the one or more ions in the plasma, and the at least one attribute of optical emissions of the plasma is an integration of the optical emission peak intensity over time.

2. A method for implanting a desired dose of an element into a substrate, comprising:
    providing a plasma reactor having a sensor configured to monitoring an attribute of optical emissions of the element in excited states;
    generating a correlation between the attribute of optical emissions of the element and a dosage value of the element;
    positioning the substrate in the plasma reactor;
    generating a plasma comprising the element in excited states in the plasma reactor;
    obtaining a real time value of the attribute of optical emissions of the element using the sensor;
    determining a real time dosage value of the element using the correlation between the attribute of optical emissions of the element and the dosage value of the element; and
    terminating the plasma when the real time dosage value is within an error range of the desired dose, wherein the attribute of optical emissions is obtained from an optical emission peak intensity of the element in excited states, and the attribute of optical emissions is an integration of the optical emission peak intensity over time.

3. A method for processing a substrate, comprising:
    positioning a substrate in a plasma reactor having an optical emission spectrometer;
    generating a plasma containing an ion species in the plasma reactor to start a plasma process;
    measuring periodically a peak intensity of the ion species in the plasma using the optical emission spectrometer;
    calculating a product of the peak intensity of the ion species and a time duration of the plasma process by integrating periodically measured peak intensity values over time; and
    ending the plasma process when the product of the peak intensity of the ion species and the time duration of the plasma process reaches a predetermined value.

4. The method of claim 3, further comprising obtaining a correlation between the dosage quantity of the ion species and the product of the peak intensity of the ion species and the time duration of the plasma process plasma.

5. The method of claim 3, wherein the generating a plasma comprises generating a plasma using a toroidal plasma source connected to a processing volume of the plasma reactor.

6. The method of claim 5, wherein the optical emission spectrometer is positioned outside a window formed through the plasma reactor.

7. The method of claim 3, wherein the plasma process is plasma immersion ion implantation.

8. The method of claim 7, wherein the ion species comprises Boron (B), Arsenic (As), Phosphorus (P), Hydrogen (H), Oxygen (O), Fluorine (F), Silicon (Si), or combinations thereof.

* * * * *